United States Patent
Nojo et al.

(10) Patent No.: US 9,676,966 B2
(45) Date of Patent: Jun. 13, 2017

(54) CHEMICAL MECHANICAL POLISHING COMPOSITION AND PROCESS

(75) Inventors: Haruki Nojo, Kanagawa (JP); Akitoshi Yoshida, Chiba (JP); Hirofumi Kashihara, Kanagawa (JP); Pascal Berar, Hayward, CA (US)

(73) Assignee: Air Products and Chemicals, Inc., Allentown, PA (US)

( * ) Notice: Subject to any disclaimer, the term of this patent is extended or adjusted under 35 U.S.C. 154(b) by 2418 days.

(21) Appl. No.: 10/534,699

(22) PCT Filed: Nov. 13, 2003

(86) PCT No.: PCT/US03/36618
§ 371 (c)(1),
(2), (4) Date: Jan. 22, 2009

(87) PCT Pub. No.: WO2004/044076
PCT Pub. Date: May 27, 2004

(65) Prior Publication Data
US 2009/0197412 A1    Aug. 6, 2009

(30) Foreign Application Priority Data
Nov. 13, 2002   (JP) .................................. 2002-329464

(51) Int. Cl.
*H01L 21/302*   (2006.01)
*C03C 15/00*   (2006.01)
*C09G 1/02*   (2006.01)

(52) U.S. Cl.
CPC ..................................... *C09G 1/02* (2013.01)

(58) Field of Classification Search
USPC ......... 216/88, 89, 90; 438/692, 693; 51/307; 252/79.1
See application file for complete search history.

(56) References Cited

U.S. PATENT DOCUMENTS

| | | | |
|---|---|---|---|
| 5,607,718 A | 3/1997 | Sasaki et al. | |
| 6,332,831 B1* | 12/2001 | Shemo et al. | 451/41 |
| 6,379,230 B1* | 4/2002 | Hayashi et al. | 451/292 |
| 2002/0034875 A1 | 3/2002 | Park et al. | |
| 2002/0129559 A1* | 9/2002 | Ito et al. | 51/307 |
| 2006/0248804 A1* | 11/2006 | Yoshida et al. | 51/309 |

FOREIGN PATENT DOCUMENTS

| | | |
|---|---|---|
| JP | 7-86215 A | 3/1995 |
| JP | 7-254579 A | 10/1995 |
| JP | 8-316179 A | 11/1996 |
| JP | 11-140427 A | 5/1999 |
| JP | 2000-109803 A | 4/2000 |
| WO | 02/083804 A1 | 10/2002 |

* cited by examiner

*Primary Examiner* — Shamim Ahmed
(74) *Attorney, Agent, or Firm* — Lina Yang

(57) ABSTRACT

To provide a polishing slurry composition which effectively reduces the occurrence of scratches, and a method of polishing which reduces the occurrence of scratches while realizing an economical polishing step. The aforementioned object is attained by using a polishing slurry composition for polishing a semiconductor substrate containing a metal oxide particle, at least one water-soluble organic polymer and water, said slurry composition characterized in that, when a test substrate having a metal film, a shallow trench isolation film or dielectric film is polished by varying a rate of a polishing pad equipped in a polishing apparatus under a constant polishing pressure to achieve a maximum polishing rate.

29 Claims, 1 Drawing Sheet

CHEMICAL MECHANICAL POLISHING COMPOSITION AND PROCESS

BACKGROUND OF THE INVENTION

Field of the Invention

The present invention relates to a slurry composition used for the planarization technique by Chemical Mechanical Polishing (hereinafter, referred to as "CMP") which is one step of a process of manufacturing a semiconductor device, and a method of using the same.

Description of Related Art

In a process of manufacturing a semiconductor device, a multi-layered laminated structure in which many layers of an insulating film, a metal film and the like is generally formed on a shallow trench isolation film on a substrate. Generally, upon multi-layered lamination, it is necessary to deposit an interlayer dielectric film or a metal film on the substrate after the shallow trench isolation film, to subject the produced irregularities to a planarization treatment through chemical mechanical polishing (CMP), and to laminate a new wiring layer on the planarized surface.

Recently, as the miniaturization of a semiconductor device progresses in each layer of a multi-layered laminated structure on a substrate, planarization at an increasingly higher precision becomes necessary. For this reason, the need for a CMP step is intensifying, and a planarization step by CMP becomes important in a process of manufacturing a semiconductor device.

As for a polishing slurry composition used in this CMP step, recently, one containing alumina as a metal oxide polishing particle has been used for a hard metal film, such as a tungsten film and the like, and a polishing slurry containing silica as a polishing particle has been used for a soft metal film, such as copper and the like. In such a polishing slurry, alumina and silica are mixed together with an additive for controlling a selective ratio between a metal film, a barrier film or an oxide film. In addition, in planarization polishing of an interlayer dielectric film and a shallow trench isolation film, silica particles and ceria particles are used as the polishing particle. In such a polishing slurry composition, since silica particles only have a mechanical polishing function, a polishing rate (processing rate) improving additive, such as potassium hydroxide and ammonia, may be added to the slurry composition. On the other hand, since ceria particles cause a slight chemical reaction with the $SiO_2$ surface, which is a component of a film, it is not as necessary to use an additive. Furthermore, the use of ceria particles provide a rapid processing rate. For this reason, a polishing slurry composition containing ceria is expected to perform better and has been initiated in industrial use as a means to improve throughput.

It has been known that the planarization property is not better when using a polishing slurry in which only the metal oxide particle has been dispersed. For this reason, besides metal oxide particles, various additives, for example, surfactants, water-soluble organic polymers, organic acids, and chelating agents, have been used for the purpose of improving planarization.

For example, it has been known that when a water-soluble organic polymer, such as polyethylene oxide, polyvinyl alcohol, alginates, guar gum, carboxylmethylcellulose, hydroxylethylcellulose and polyacrylate, is added to a polishing slurry composition with metal oxide particles dispersed in water, dishing is less likely to occur when polishing the layers of interlayer dielectric film, shallow trench isolation film, and the metal film due to the improved planarization effect.

However, problems can develop when the substrate surface layers are polished and planarized with such a polishing slurry composition under a polishing pressure and a platen rotating rate normally adopted in CMP. As a water-soluble organic polymer is added to a slurry composition, there is a tendency for the processing rate to decrease. Also, when the thickness of the substrate surface layers to be polished is small, the polishing rate is reduced. At the same time, scratching occurs, and planarization deteriorates noticeably.

For example, the use of the following slurry compositions are known: a polishing slurry containing a ceria particle as a polishing particle and ammonium polycarboxylate as a water-soluble organic polymer (see Japanese Patent No. 3278532, which is incorporated by reference); a polishing slurry composition containing an alumina particle as a polishing particle and polyacrylic acid as a water-soluble organic polymer (see Japanese Patent No. 3130279, which is incorporated by reference); and a cerium oxide polishing slurry containing a cerium oxide particle, a copolymer of ammonium acrylate and methyl acrylate, and water (see JP-A 2000-17195, which is incorporated by reference). However, scratching increases when the substrate surface layers are polished and planarized through the use of one of the above polishing slurry compositions, even though dishing is prevented and planarization improves.

For this reason, it was necessary to perform a final polishing step using another slurry, such as one with small, soft particles, such as silica, after the aforementioned polishing and planarization steps in many cases, to remove the scratches created by the use of the previously mentioned slurry compositions. Because of the scratching problems, it became necessary to incorporate this time-consuming additional polishing step to remove the scratches, which typically includes the removal of the polishing slurry composition used in the former planarization polishing step, the washing of the polishing apparatus and pad, and the preparation and use of the slurry for the final polishing step. Alternatively, if another polishing apparatus is used for the final polishing step than the one used in the previous planarization polishing step, the polished substrates need to be transferred from one polishing apparatus to another, which is economically costly as well as time consuming.

Unlike the case where scratches are from the dresser, a pad dust and the like, scratches created by the polishing slurry composition cannot be solved by improving control of the polishing apparatus and work procedures without fundamentally improving the polishing slurry composition. Reducing the occurrence of scratches is an important goal in planarizing a device. The attainment of this goal becomes more important as miniaturization of a device becomes indispensable. For example, various problems that retard the manufacturing process, such as an increase in the resistance and breaking of the wire due to flawed wiring and a flawed interlayer dielectric film such as an easily flawed low-k film, can be resolved by reducing the occurrences of scratching.

Therefore, it is desirable to have a polishing slurry composition that effectively reduces the occurrences of scratching and a method of polishing that reduces the occurrences of scratching while realizing an economical polishing step.

SUMMARY OF THE INVENTION

The present invention provides a polishing slurry composition for polishing a semiconductor substrate having at least one of a metal film, a shallow trench isolation film, or a dielectric film. The slurry composition comprises a metal oxide particle, at least one water-soluble organic polymer, and water. The slurry composition is characterized in that it exhibits a peak when measuring the polishing rate compared with the relative rate of movement of the polishing pad relative to the substrate while maintaining a constant pressure between the polishing pad and the substrate. The constant polishing pressure, for example, can be from about 1 psi (6.9 kPa) to about 9 psi (62.1 kPa) with the polishing pad provided, for example, on a rotatable platen. The relative movement is the rotational movement of the pad relative to the substrate and in a preferred embodiment, the peak in the substrate removal rate versus polishing pad-substrate movement rate curve peak is found within a pad rotation rate of from about 12 rpm to about 150 rpm.

In one embodiment of the present invention, the polishing slurry composition comprises a plurality of water-soluble organic polymers, wherein the water-soluble organic polymers each have an average molecular weight with at least one lighter water-soluble organic polymer having an average molecular weight that is between about 15% to about 95% of the average molecular weight of another, heavier, water-soluble organic polymer. The weight ratio of the heavier water-soluble organic polymer to the lighter water-soluble organic polymer is from about 95:5 to about 5:95. Moreover, at least one of the water-soluble organic polymer(s) is a polyacrylic acid salt, a polyvinyl alcohol, a polyethylene oxide, a polyethylene glycol, an alginic acid, guar gum, a carboxylmethylcellulose, a hydroxymethylcellulose, or salts thereof, or combinations thereof. The content of the water-soluble organic polymer(s) is about 0.01% by weight to about 3% by weight based on the total amount of the composition. Alternatively, the content of the water-soluble organic polymer(s) is about 0.05% by weight to about 1.5% by weight based on the total amount of the composition.

In addition, there are several embodiments of the polishing slurry composition that may be used, based on the metal oxide selection. In one embodiment, the metal oxide particle used in the polishing slurry composition comprises ceria having an average particle diameter, wherein the average particle diameter of ceria is about 0.03 μm to about 0.5 μm, with a solid content of the metal oxide particles in the slurry composition being about 0.1% by weight to about 20% by weight based on the total amount of the composition. In a second embodiment, the metal oxide particle used in the polishing slurry composition comprises silica having an average particle diameter, wherein the average particle diameter of silica is about 0.03 μm to about 0.5 μm, with a solid content of the metal oxide particles in the slurry composition being about 0.1% by weight to about 20% by weight based on the total amount of the composition. In a third embodiment, the metal oxide particle used in the polishing slurry composition comprises alumina having an average particle diameter, wherein the average particle diameter of alumina is about 0.03 μm to about 0.5 μm with a solid content of the metal oxide particles in the slurry composition being about 0.1% by weight to about 20% by weight based on the total amount of the composition.

The present invention also provides a method of polishing a semiconductor substrate, which comprises polishing a substrate with a polishing slurry composition according to the present invention, wherein the polishing slurry composition is disposed between the substrate and a polishing pad while holding a portion of the pad and the substrate in a position to create a polishing pressure then moving at least one of the polishing pad or substrate to obtain a relative movement rate between the polishing pad and the substrate, thereby polishing a semiconductor substrate. In one embodiment, the relative movement rate between the polishing pad and the substrate is within about 30% of the relative movement rate that provides the peak substrate removal rate at the polishing pressure. In a second embodiment, the relative movement rate between the polishing pad and the substrate is within about 15% of the relative movement rate that provides the peak substrate removal rate at the polishing pressure. In a third embodiment, the relative movement rate between the polishing pad and the substrate is the relative movement rate that provides the peak substrate removal rate at the polishing pressure. In a fourth embodiment, the relative movement rate between the polishing pad and the substrate varies, wherein an average relative movement rate between the polishing pad and the substrate is within about 30% of the relative movement rate that provides the peak substrate removal rate at the polishing pressure. In a fifth embodiment, the relative movement rate between the polishing pad and the substrate varies, wherein an average relative movement rate between the polishing pad and the substrate is within about 15% of the relative movement rate that provides the peak substrate removal rate at the polishing pressure.

According to the methods of the present invention, the polishing step comprises a first planarization step and a final polishing step, wherein any embodiment of the polishing slurry composition of the present invention is used in both the first planarization step and the final polishing step. In addition, the same polishing slurry composition may be used in both the planarization step and the final polishing step. The relative movement rate between the polishing pad and the substrate in the planarization step is higher than the relative movement rate between the polishing pad and the substrate in the final polishing step. The polishing pressure in the planarization step is lower than the polishing pressure in the final polishing step, wherein in both the planarization step and the final polishing step the relative movement rate between the polishing pad and the substrate is within 30% of the relative movement rate that provides the peak substrate removal rate at the polishing pressure. In a different embodiment, the polishing pressure in the planarization step is lower than the polishing pressure in the final polishing step, wherein in both the planarization step and the final polishing step the relative movement rate between the polishing pad and the substrate is within about 15% of the relative movement rate that provides the peak substrate removal rate at the polishing pressure. In another embodiment, the polishing pressure in the planarization step is lower than the polishing pressure in the final polishing step, wherein in both the planarization step and the final polishing step the relative movement rate between the polishing pad and the substrate is the relative movement rate that provides the peak substrate removal rate at the polishing pressure. Moreover, the polishing pressure in the planarization step is lower than the polishing pressure in the final polishing step, wherein the relative movement rate between the polishing pad and the substrate in the planarization step is higher than the relative movement rate between the polishing pad and the substrate in the final polishing step.

According to the method of the present invention, the semiconductor substrate with at least one kind of a film selected from the group consisting of an interlayer dielectric film, a shallow trench isolation film and a metal film.

DESCRIPTION OF THE PREFERRED EMBODIMENTS

Figure 1:
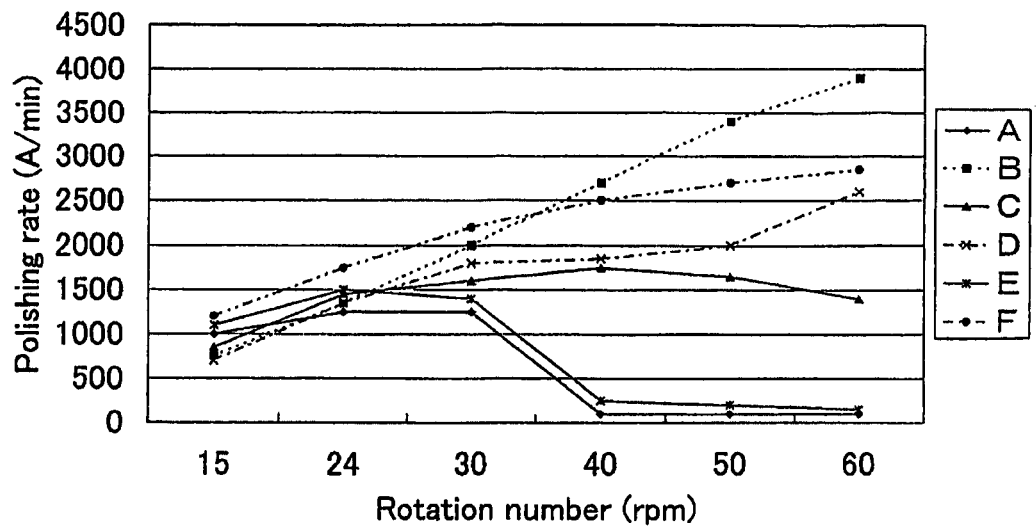
FIG. 1 is a graph that shows the polishing rates obtained by using polishing slurry compositions A-F with the longitudinal axis representing the polishing rate and the transverse axes representing the pad rate.

The polishing slurry composition according to the present invention will be explained below.

The present invention provides a slurry composition for polishing a semiconductor substrate, further comprising a metal oxide particle, a water-soluble organic polymer, and water. The slurry composition is characterized by its ability to polish a substrate having a metal film, a shallow trench isolation film or an insulating by varying the rate of the polishing pad under a constant polishing pressure to achieve maximum removal.

Herein, "a pad rate-polishing rate curve exhibits a peak" means that when a substrate is polished by the polishing slurry composition of the present invention by varying the rate of movement of the polishing pad in a range normally adopted in CMP, while maintaining a constant polishing pressure, a maximum value of the polishing rate is eventually reached, as the pad rate is increased from a minimum value with the polishing rate being increased. After reaching a maximum value of the polishing rate, the polishing rate does not exceed the maximum value, even when the pad rate is further increased. In a preferred embodiment, the peak is a maximum within the normal range of CMP polishing pressure for a rotatable platen system, in which the peak represents a maximum removal rate. Removal rates at higher pad rates may be lower than the removal rate at the peak. All other substrate removal rates are less than the maximum removal rate, and the polishing rates at pad rates both above and below the peak are less than the maximum removal rate. It should be recognized that the peak may occur at different polishing rates when different polishing pressures are used.

On the other hand, under the normally adopted CMP conditions, the nature of the previously used polishing slurry composition in the prior art is such that it will increase the processing rate approximately proportional with the polishing pressure and pad rate.

By polishing a semiconductor substrate with a polishing slurry composition that achieves maximum removal under a constant polishing pressure, the planarized surface exhibits an extremely small level of scratching. In addition, when using the aforementioned slurry composition in a semiconductor substrate polishing step comprising a planarization polishing step and a final polishing step, one slurry composition can be utilized in both steps.

The difference between how previous slurry compositions and the aforementioned polishing slurry composition of the present invention work is considered below.

Polishing proceeds, depending on the magnitude of the shear stress between the substrate and the metal oxide particle, which is the abrasive component. However, since this shear stress grows as the rate of the polishing pad is increased, and as a result, the pad rate is raised, which means more polishing. Then the water-soluble organic polymer in the polishing slurry composition of the present invention facilitates the sliding between the metal oxide particle and the substrate, but increased sliding leads to a decrease in the polishing force. For this reason, in using the slurry composition of the present invention with an increased processing rate under a constant polishing pressure until the pad rate reaches the rate in which the polishing rate maximum value has been reached, the sliding property of the water-soluble organic polymer in the slurry composition begins to prevail. As a result, the polishing force is decreased, so the processing rate is also decreased.

In contrast, with respect to the previous polishing slurry compositions, even when the pad rate is increased to the range normally adopted in CMP processing, the increase in the polishing force is accompanied by an increase in the shear stress of the metal oxide particle, which always exceeds the increase in the sliding property of the water-soluble polymer. The processing rate is increased approximately proportional to the pad rate.

Of course, such a mechanism is merely an assumption, and the present invention is not limited to such a mechanism.

In using the polishing slurry composition of the present invention, a "test substrate" was polished with the slurry composition, with the results plotted in a graph of the pad rate versus the polishing rate. The "test substrate" is not particularly limited to any type, as long as it is a substrate having a plain film comprising a metal film, a shallow trench isolation film or an insulating film (interlayer dielectric film, nitride film etc.).

In addition, a constant polishing pressure imposed on the test substrate may be in a polishing pressure range that is normally used in CMP processing, but preferably in a range of about 1 psi (6.9 kPa) to about 9 psi (62.1 kPa).

The type of polishing apparatus used in the present invention is not very particular, as long as the relative movement rate of the center of the test substrate to the polishing pad is in the range normally adopted by CMP. Examples of suitable polishing apparatus types can include: (1) a rotatable platen system having a rotatable platen associated therewith a polishing pad and a mechanism for retaining the substrate (i.e., a carrier); (2) a belt system, for example, having a belt drive associated therewith a polishing pad that moves in a pre-defined direction straight direction and having a mechanism for retaining the substrate (i.e., a carrier); (3) an orbital system having a platen associated with the polishing pad and moves on an elliptical orbit and a mechanism for retaining the substrate (i.e., a carrier); and (4) an optidian system. In the present invention, a rotatable platen system is preferably used.

For example, when a rotatable platen system is adopted, the relative movement rate of the center of the polished substrate to the polishing pad can be calculated as follows. For example, when the Ebara EP0222D type polishing apparatus (platen diameter about 610 mm) is used as a polishing apparatus, the center of the top ring is situated in a location about 170 mm from the center of the platen and when the rotation rate of the platen is 12 rpm, the relative movement rate of the substrate center is 2×17.0×3.14×12 cm/min and, thus, 12.81 m/min. In addition, when the rotating rate of the platen is 100 rpm, the rate is 106.76 m/min.

In addition, the pad rate may be varied within a range normally adopted in CMP processing. When a rotatable platen system is adopted, it is preferable that the polishing rate achieves the maximum value while the pad rate (rotation rate of the platen) is in the range of about 12 rpm to about 150 rpm, and it is more preferable that the polishing rate achieves the maximum value while the pad rate is in the range of 15 rpm to 60 rpm.

In this case, it is preferable that the rotation number of the top ring, which retains and rotates the substrate, is about 0.5 to about 2.5-fold, and preferably about 1 to about 1.3-fold for the rotation number of the platen. For example, it is preferable that the rotation number of the top ring is about 12-16 rpm when the rotation number of the platen is about 12 rpm.

Examples of the metal oxide particle used in the polishing slurry composition of the present invention include alumina, silica, ceria and the like.

Examples of alumina particle types include: (1) α-alumina that was calcinated and contains a small amount of γ-alumina; and (2) an alumina particle that can be obtained by grinding and sieving α-alumina. It is preferable to use alumina having an average particle diameter of about 0.03 μm to about 0.5 μm. Another example of alumina includes colloidal alumina consisting of γ-alumina or boehmite, although not as preferable since this type of particle is too soft. Examples of silica particle types include colloidal silica and high purity colloidal silica, which can be obtained by dispersing a misty, superfine silica powder into water. Colloidal silica can be obtained by removing sodium from water glass and therefore polymerizing the silica. High purity colloidal silica can be obtained by hydrolyzing tetramethoxysilane or tetraethoxysilane, which is an organic alkoxide, and converting the hydrolysate into a colloid that can be used. One example of a ceria particle type used in the polishing slurry composition can be obtained by reacting cerium hydroxide and the like with an aqueous solution of nitrate, sulfate or chloride of cerium, which is then neutralized or heat-aged, washed with water, dried, calcinated, and optionally grounded and sieved. Another example of the ceria used in the polishing slurry composition can be obtained by dispersing misty ceria into water, in which the misty ceria can be obtained by using chloride, nitrate, or an organic acid salt of cerium as a raw material and treated according to the process used for the misty superfine silica. In another embodiment, ceria may also be prepared by utilizing superfine cerium oxide that can be obtained by a chemical vapor deposition method using an organic cerium compound. Another possibility is to use a colloidal ceria that is dispersed in water, which can obtained by hydrolyzing an aqueous solution of cerium nitrate, sulfate or chloride, or cerium alkoxide.

In the present invention, it is preferable that the metal oxide particle is silica or ceria, and it is particularly more preferable that the metal oxide particle is ceria.

In the present invention, it is preferable that the purity of the metal oxide particle to be used is such that the level of alkali metals, such as K, Na and Li, is 1000 ppm or less and the level of heavy metals, such as Ni, Zn and Pb, is 100 ppm or less, relative to the content in the slurry composition. It is more preferable that the content of these impurities in the slurry composition is 1/10-1/100 or less than the above levels.

The average particle diameter of the metal oxide particle used in the present invention is in the range of about 0.03 μm to about 0.5 μm and, in particular, a particle diameter of about 0.08 μm to about 0.3 μm is preferable. A particle of less than about 0.03 μm is generally too fine, making the processing rate too slow and not economical. In addition, when using metal oxide particles having a particle diameter exceeding about 0.5 μm, the processing rate is generally great, but more scratching occurs, which is not preferable.

In the present invention, the solid content of metal oxide particles in the polishing slurry composition is preferably 0.1% by weight to 20% by weight, based on the total amount of the composition, and with 0.2% by weight to 10% by weight as the more preferred range. When the solid content is less than 0.1% by weight, there is a tendency for the processing rate to be slow, which is not preferable. In the case of the solid content exceeding 20% by weight, it is extremely difficult to set the polishing conditions under which maximum removal is achieved, and it is difficult to obtain stable polishing conditions, which is not preferable.

Examples of a water-soluble organic polymer contained in the present polishing slurry composition include polyacrylic acid, polyethylene oxide, polyvinyl alcohol, polyethylene glycol, alginic acid, guar gum, carboxylmethylcellulose, hydroxymethylcellulose and salts thereof. It is preferable to use polyacrylic acid or polyacrylate, and it is particularly more preferable to use ammonium polyacrylate.

Herein, "water-soluble" in the "water-soluble organic polymer" includes not only the state in which the polymer is completely dissolved in water, but also the state in which the polymer is dispersed in water but only partially dissolved in water.

In the present invention, the polishing slurry composition, in which maximum removal is achieved under a constant polishing pressure, can be obtained, for example, by the inclusion of two or more kinds of water-soluble organic polymers having a different weight average molecular weight than the aforementioned water-soluble organic polymer.

When the present polishing slurry composition contains two or more kinds of water-soluble organic polymers having a different weight average molecular weight, these water-soluble polymers behave independently in the slurry composition, whereby the polishing results in a planarized substrate surface having an extremely small amount of scratches. As already described, water-soluble polymers provide the sliding effect in the present slurry composition, respectively, and this effect is different depending on the type of water-soluble polymer. For example, it can be presumed that the effect of positively preventing scratches caused by the metal oxide particle is manifested by the partial attachment to the metal oxide particle or the dispersion of the metal oxide particle.

Of course, such a mechanism is merely an assumption, and the present invention is not limited to such a mechanism.

In the present invention, the total solid content of the two or more kinds of water-soluble organic polymers in the polishing slurry composition is preferably about 0.01% by weight to about 3% by weight based on the total amount of the composition, more preferably about 0.05% by weight to about 1.5% by weight. When the total solid content is less than about 0.01% by weight, it tends to extremely difficult to set the polishing conditions to achieve maximum removal, which is not preferable. On the other hand, when the total solid content exceeds about 3% by weight, the processing rate tends to become extremely low, which makes it uneconomical while worsening the dispersibility of the slurry and the preventative effect of forming scratches; all of which are not preferable.

Two or more kinds, preferably two to three kinds of water-soluble organic polymers used in the present invention have a different weight average molecular weight. As examples of weight average molecular weight, in the case of the two kinds of water-soluble organic polymers, the weight average molecular weight of a water-soluble organic polymer with the lower molecular weight is preferably about 15% to about 95% of that of the polymer with the higher molecular weight, more preferably about 25% to about 75%, even more preferably, about 30% to about 60%. As examples of a group of such a weight average molecular weight, depending on how the molecular weight is measured, there are two groups of 8,000-24,000 and 26,000-50,000, and groups of 10,000-20,000 and 27,000-40,000 are preferable.

A ratio of the content of the first group and that of the second group is preferably about 95:5 to about 5:95, more preferably about 90:10 to about 50:50.

In case of using three or more kinds of water-soluble organic polymers in the present invention, which have all different molecular weights, it includes the case in which a molecular chain of each of the two kinds of water-soluble organic polymers is broken so that three or more kinds of water-soluble organic polymers are comprised in the polishing slurry composition.

Weight average molecular weights of these water-soluble organic polymers can be measured, for example, by a gel permeation chromatography (GPC) analyzing apparatus. According to this method, a molecular weight of a few hundred to a few hundred thousand can be measured, and a weight average molecular weights of two or more kinds of water-soluble organic molecules can be measured, respectively. Note that, in the specification, the weight average molecular weights were measured by GPC using polyethylene glycol as a standard material, unless otherwise noted.

Examples of a combination of two or more kinds of water-soluble organic polymers include:

(1) the case in which ammonium polyacrylate having a weight average molecular weight of about 12,000 to about 20,000, and ammonium polyacrylate having a weight average molecular weight of about 22,000 to about 40,000 are used with a ratio of the contents being about 70:30 to about 90:10, and (2) the case in which ammonium polyacrylate having a weight average molecular weight of about 14,000 to about 22,000, and ammonium polyacrylate having a weight average molecular weight of about 26,000 to about 42,000 are used with a ratio of the contents being about 60:40 to about 90:10.

pH of the present polishing slurry composition is not particularly limited, but about 4 to about 10 is preferable, and about 4 to about 6 is more preferable.

For example, in the present slurry composition containing ceria particles with a particle diameter of 0.12 µm, ammonium polyacrylate having a weight average molecular weight of about 16,500, and ammonium polyacrylate having a weight average molecular weight of about 30,500 as a water-soluble organic polymer, a planarized plane having extremely small number of scratches can be obtained.

The present polishing slurry composition can be obtained by adding a predetermined amount of water to a container equipped with a stirrer, adding a powder or a colloid dispersion of a metal oxide article while stirring, mixing them uniformly, treating them with a dispersing apparatus for diminishing aggregates, such as using a colloid mill, a high-speed dispersing machine, an ultrasound dispersing machine and a ball mill, and further adding and mixing a water-soluble organic polymer with the other components. When two or more kinds of water-soluble organic polymers are used, they may be mixed in advance, or they may be added directly thereafter. As for the order of adding the powder or colloid dispersion of metal oxide particle and water-soluble organic polymer and as for the method of stirring and dispersing them, any order and method may be adopted so long as the beneficial effect of the present invention in reducing scratches can be attained upon use of the finally obtained slurry composition for polishing.

Various additives may be added to the present polishing slurry composition in such a range that the effect of the present invention is not prevented. Examples of such additives include a surfactant, a flowability adjusting agent, an oxidizing agent, an anti-corrosion, a corroding agent, a buffering solution, and a chelating agent.

Also, the present invention provides a polishing method which comprises polishing a semiconductor substrate using the present polishing slurry composition as described above. According to the present polishing method, a planarized substrate surface having extremely small number of scratches can be obtained.

According to the present polishing method, not only in the case where a polishing step is divided into a planarization polishing step and a final polishing step, but also in the case where the polishing step is performed in one step, polishing can be performed by using the same slurry composition.

According to the previous polishing method, in the former planarization polishing step, that is, in a step of performing planarization processing so that the thickness of the various surface layers of the patterned wafer, such as an interlayer dielectric film and a barrier film, is reduced, it was necessary to have a polishing slurry composition that has a great processing rate and better planarization property. On the other hand, in the latter final polishing step, a different slurry from that of the former step is prepared, and scratches produced on the surface of the substrate in the former step are removed.

To the contrary, in the present method, since the same slurry composition can be used in a planarization polishing step and a final polishing step, it is not necessary to change the slurry composition. Various problems come with the changing of the slurry composition. For example, such problems are related to the washing of the polishing apparatus and the like and the preparation of a new polishing apparatus. These problems are all solved by the present invention. It becomes unnecessary to use a multiplaten in which a plurality of platens are provided on one polishing apparatus. Additionally, the time necessary for the polishing step can be shortened, while producing other benefits such as the saving of another tank for the slurry composition, the saving of a supplying line, and the like.

In the present polishing method, a film formed on the substrate is polished while the present slurry composition is used on the polishing pad of the polishing apparatus. As for the polishing apparatus, any of the polishing apparatus types as described above can be used. As for the polishing conditions, the polishing conditions normally adopted in CMP can be implemented. As for the polishing pad, general unwoven fabric, expandable polyurethane, and porous fluorine resin can be used, but not limited to these types of pads. In addition, it is preferable to perform groove processing on the pad such that the slurry composition stays in the pad.

In the present polishing method, it is preferable that the rate of the polishing pad in the former planarization polishing step is higher than the rate of the polishing pad in the latter final polishing step, and the polishing pressure in the planarization polishing step is lower than the polishing pressure in the final polishing step. When such polishing conditions are adopted, the scratch reducing effects are further enhanced.

When a rotatable platen system is adopted for the polishing apparatus, for example, it is preferable that polishing is performed by using a polishing pressure of about 2 psi (13.8 kPa) to about 3 psi (20.7 kPa) and a rotation number of a platen of about 100 rpm in the former planarization polishing step and using a polishing pressure of about 5 psi (34.5 kPa) to about 7 psi (48.3 kPa) and a rotation number of about 15 rpm to about 35 rpm in the latter final polishing step. Alternatively, by appropriately setting the polishing conditions, the polishing pressure and pad rate can be the same in the former step and the latter step. This can be accomplished by selecting the conditions near the normally adopted conditions in. the latter final polishing step as the polishing conditions in the former polishing step.

Examples of a preferable semiconductor substrate to be polished by the present polishing method include silicon wafers having a SiO$_2$ film, and particularly preferable examples include a device wafer provided with an interlayer dielectric film (including low-k film) or a shallow trench isolation film. In addition, examples include substrates provided with metal film.

As explained above, according to the polishing slurry composition, a planarized substrate surface with an extremely small number of scratches can be obtained. In addition, according to the present slurry composition, polishing steps in which separate slurry compositions must be used previously can now be dealt with by one slurry composition. In addition, according to the present invention, precipitation and separation of the metal oxide particle in the lower layer can be prevented, and better dispersibility of the particles can be retained. Therefore, the work required for re-dispersing the slurry composition before polishing becomes unnecessary, and the processing rate variation problem during polishing is resolved.

Examples of the present invention will be explained below, but the technical scope of the present invention is not limited to them.

(1) Pad Rate-Polishing Rate Curve

According to compositions listed in Table 1, eight kinds of polishing slurry compositions (A-J) were prepared, and pad rate-polishing rate curves were obtained, respectively.

In Table 1, PAANH$_4$ means ammonium polyacrylate, and PVA means polyvinyl alcohol. Polyvinyl alcohol purchased from Shin-Etsu Chemical Co., Ltd. was used (weight average molecular weight is shown in Table 1, which was provided by the above company).

As for the polishing apparatus, the Ebara EPO-222D. was used. As for the polishing pad, a bilayer pad of IC-1000/SUBA400 was used. In addition, as for the test substrate, a 200 mm wafer having a ILD plain film by ozone TEOS at a film thickness of 15000 Å was used.

As for the polishing conditions, the load was maintained constant at 200 g/cm$^2$, the flow rate of polishing slurry composition was 120 ml/min, the rotation number of the platen was varied from 15 rpm to 60 rpm, and the rotation number of the top ring was 1.2-fold of the rotation number of the platen.

Regarding each of the eight kinds of polishing slurry compositions, the change in the processing rate and the rotation number of each platen is plotted to examine whether a maximum value (peak) exists in the processing rate. The measurement of the processing rate is performed by the Nanospec 6100 thin film measuring apparatus of Nanometrics Corporation.

Figure 2:
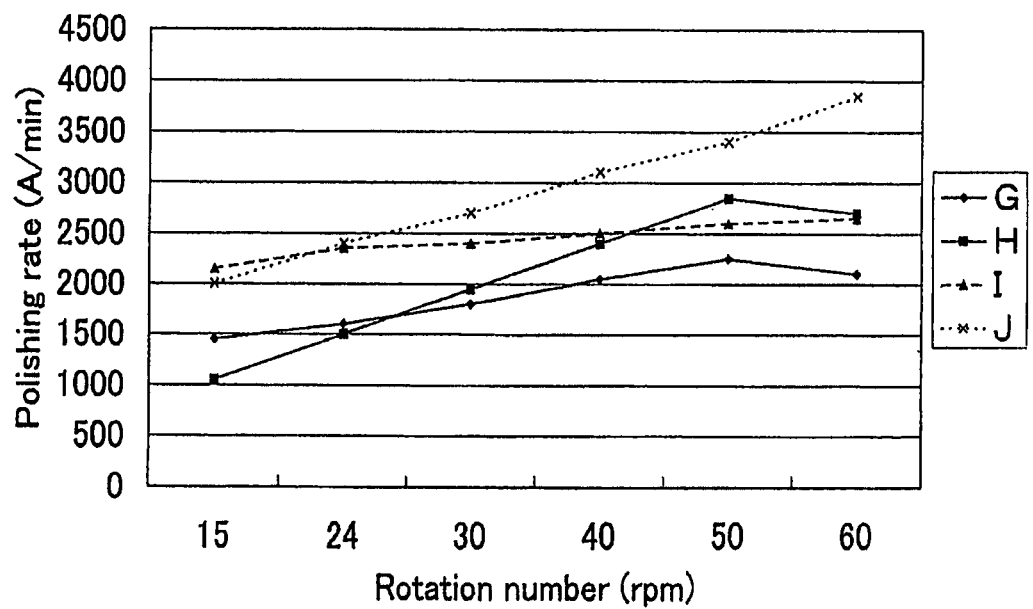
FIG. 2 is graph that shows the polishing rates obtained by using polishing slurry compositions G-J, with the longitudinal axis representing the polishing rate and the transverse axes representing the pad rate.

The results of the measurements of the processing rate and the rotation number of each platen are shown in Table 2. Graphs plotting pad rate-polishing rate based on Table 2 are shown in FIG. 1 (A-F) and FIG. 2 (G-J).

TABLE 2

Polishing Rate (Å per minute) Versus Platen Rotational Speed

| Slurry composition | 15 rpm | 24 rpm | 30 rpm | 40 rpm | 50 rpm | 60 rpm | Peak |
|---|---|---|---|---|---|---|---|
| A | 1000 | 1250 | 1250 | 100 | 100 | 100 | Yes |
| B | 750 | 1350 | 2000 | 2700 | 3400 | 3900 | No |
| C | 850 | 1450 | 1600 | 1750 | 1650 | 1400 | Yes |
| D | 700 | 1350 | 1800 | 1850 | 2000 | 2600 | No |
| E | 1100 | 1500 | 1400 | 250 | 200 | 150 | Yes |
| F | 1200 | 1750 | 2200 | 2500 | 2700 | 2850 | No |
| G | 1450 | 1600 | 1800 | 2050 | 2250 | 2100 | Yes |
| H | 1050 | 1500 | 1950 | 2400 | 2850 | 2700 | Yes |
| I | 2150 | 2350 | 2400 | 2500 | 2600 | 2650 | No |
| J | 2000 | 2400 | 2700 | 3100 | 3400 | 3850 | No |

In Table 2, a processing rate (polishing rate) unit is Å/min.

As seen from Table 2, polishing slurry composition A is the present slurry composition having a maximum polishing rate value at a platen rotation number of 24 rpm-30 rpm, with slurry composition C at 40 rpm, slurry composition E at 24 rpm, and the slurry compositions G and H at 50 rpm, respectively. In addition, slurry composition A was diluted four-fold with water in order to prepare for the slurry composition. The pad rate-polishing rate curve examines this relationship by finding that the processing rate has a maximum value at a rotation number of 40 rpm.

(2) Polishing Test (Polishing Slurry Compositions A-D)

A polishing test was performed by using polishing slurry compositions A-D obtained in (1) and employing the polishing apparatus and polishing pad used in (1). As for the substrate to be polished, a pattern wafer was employed, in which a p-TEOS oxide film having a thickness of 15000 Å formed on a 200 mm Si wafer. The wafer also has a pattern

TABLE 1

| | Metal oxide particle | | Water-soluble organic polymer 1 | | | Water-soluble organic polymer 2 | | | |
|---|---|---|---|---|---|---|---|---|---|
| | Kind | Particle diameter (nm) | Contents (wt %) | Kind | Molecular Weight | Contents (wt %) | Kind | Molecular Weight | Contents (wt %) | pH |
| A | Ceria | 0.12 | 1.0 | PAANH$_4$ | 16,500 | 0.20 | PAANH$_4$ | 30,500 | 0.05 | 5.0 |
| B | Ceria | 0.12 | 1.0 | — | — | — | — | — | — | 5.0 |
| C | Ceria | 0.12 | 0.25 | PAANH$_4$ | 16,500 | 0.048 | PAANH$_4$ | 30,500 | 0.012 | 5.3 |
| D | Ceria | 0.12 | 0.25 | — | — | — | — | — | — | 5.5 |
| E | Ceria | 0.30 | 1.5 | PAANH$_4$ | 9,000 | 0.25 | PAANH$_4$ | 30,500 | 0.25 | 6.0 |
| F | Ceria | 0.30 | 1.5 | Hectorite clay | — | 0.15 | — | — | — | 6.5 |
| G | Alumina | 0.20 | 5.0 | PAANH$_4$ | 14,000 | 0.35 | PAANH$_4$ | 28,000 | 0.15 | 4.8 |
| H | Silica | 0.15 | 6.0 | PVA | 9,000 | 0.425 | PVA | 27,000 | 0.075 | 4.5 |
| I | Ceria | 0.60 | 1.0 | Ammonium polycarboxylate | 30,000 | 6.00 | — | — | — | 8.5 |
| J | Ceria | 0.30 | 1.0 | PAANH$_4$ | 8,000 | 0.5 | — | — | — | 9.5 | having a concave part width of 10 μm and a convex part width of 5 μm, with a difference in thickness at 5000 Å.

As for the polishing conditions, the flow rate for the polishing slurry composition was 120 ml/min in the former planarization polishing step. Polishing was performed at a load of 38 g/cm² with a platen rotation number of 65 rpm for 2 minutes. In addition, in the latter final polishing step, polishing was performed at a load of 180 g/cm² with a platen rotation number of 14 rpm for 2 minutes. After polishing, the substrate was washed with flowing water for 1 minute, and dried by a spin dryer. Thereafter, the number of defects due to substrate scratches was measured. As for the measuring apparatus, KLA2351 of KLA-Tencor Corporation was used.

As a result, the number of scratches, the sizes of which were 0.2 μm or larger, produced on the substrate, which had been polished by using polishing slurry composition A of the present invention, was five per substrate. Similarly, in case of slurry composition C, which is the present slurry composition, the number of scratches was eleven. To the contrary, in case of slurry composition B, which is the previous slurry composition, the number of scratches was sixty-two. In the case of slurry composition D, the number of scratches was 77, which was too many.

In addition, polishing that only comprises the latter final polishing step was performed for five minutes using polishing slurry composition A, which is the present slurry composition, along with the same washing and drying as those described above being performed. The number of scratches was measured, and it was found that the number was twelve per substrate, which is low. To the contrary, polishing that only comprises the latter final polishing step was performed under the same conditions using polishing composition B, which is the previous slurry composition. The number of scratches was forty-three, which is too many.

(3) Polishing Test (Polishing Slurry Compositions E, F, I and J)

The same polishing test as that in (2) was performed by using polishing slurry compositions E, F, I and J obtained in (1), provided that the substrate to be polished was a pattern wafer with a shallow trench isolation film having particular layers, which was obtained by forming a pattern groove on the 200 mm Si wafer plane at a pattern density of 50%, a pitch of 10 μm and a depth of 4000 Å, and burying a high density plasma TEOS oxide film having a thickness of 6000 Å thereon.

In addition, as for the polishing conditions, a former planarization polishing step was performed at a load of 100 g/cm² with a platen rotation number of 60 rpm for two minutes. In addition, the latter final polishing step was performed at a load of 400 g/cm² with a platen rotation number of 12 rpm for two minutes.

As the result, the number of scratches, the size of which is 0.14 μm or larger, produced on a substrate which had been polished by using the slurry composition E of the present slurry composition was twenty-five per substrate, which is very low. To the contrary, in case of polishing slurry F which is the previous slurry composition, the number was 136 and, in case of the slurry composition 1, the number was 218 and, in case of the slurry composition J, the number was 177, being extremely many.

(4) Polishing Test (Polishing Slurry Compositions F, G and H)

The same polishing as that of (2) was performed by using polishing slurry compositions F, G and H obtained in (1), provided that the substrate to be polished was a pattern wafer, which was obtained by forming an ozone TEOS film having a thickness of 7000 Å on a 200 mm silicon wafer, forming a pattern groove at a pattern density of 50%, a pitch of 10 μm and a depth of 3000 Å, forming a TaN barrier film thereon, and further forming a metal film composed of deposited Cu at a thickness of 15000 Å thereon.

In addition, as for the polishing conditions, only one step was performed, which was done at a load of 120 g/cm² with a platen rotation number of 12 rpm for 3 minutes.

As a result, the number of scratches, the size of which is 0.14 μm or larger, produced on the substrate, which had been polished by using polishing slurry composition G and is the present slurry composition, was sixty-five per substrate. Similarly, in the case of slurry composition H, the present slurry composition, the number of scratches was 47, which is low. To the contrary, in the case of slurry composition F, the previous slurry composition, the number of scratches was 263, which is extremely numerous.

What is claimed:

1. A method of polishing a semiconductor substrate, which comprises:
   a) providing a semiconductor substrate having at least one of a metal film, a shallow trench isolation film, or a dielectric film;
   b) providing a slurry composition comprising: a metal oxide particle, a first water-soluble organic polymer having a first average molecular weight between 26,000 and 50,000, a second water-soluble organic polymer having a second average molecular weight that is between 15% to 95% of the first molecular weight, and water, wherein said polishing slurry composition is disposed between the substrate and a polishing pad; and
   c) holding a portion of the pad and the substrate in a position to create a polishing pressure and moving at least one of the polishing pad or substrate to obtain a relative movement rate between the polishing pad and the substrate, thereby polishing a semiconductor substrate to effect a substrate removal rate; said method characterized in that when the substrate is polished by contacting the substrate with the slurry composition disposed between the substrate and a polishing pad moving relative to the substrate, the relationship between the substrate removal rate compared with the movement of the pad relative to the substrate while maintaining a constant polishing pressure between the polishing pad and the substrate exhibits a maximum in the substrate removal rate.

2. The method of polishing according to claim 1, wherein said constant polishing pressure is from 1 psi to 9 psi and said polishing pad is provided on a rotatable platen and wherein the peak in the substrate removal rate versus polishing pad-substrate movement rate curve peak is found within a pad rotation rate of from 12 revolutions per minute to 150 revolutions per minute.

3. The method of polishing slurry according to claim 1, wherein the slurry composition comprises a third of water-soluble organic polymer, wherein the third water-soluble organic polymer has an average molecular weight different than the first and second average molecular weights.

4. The method of polishing according to claim 1 wherein the weight ratio of the first water-soluble organic polymer to the second water-soluble organic polymer is from 95:5 to 5:95.

5. The method of polishing according to claim 1, wherein at least one of said water-soluble organic polymer(s) is a polyacrylic acid salt.

6. The method of polishing claim 1, wherein at least one of said water-soluble organic polymer(s) is a polyvinyl alcohol.

7. The method of polishing according to claim 1, wherein at least one of said water-soluble organic polymer(s) is a polyethylene oxide, a polyethylene glycol, an alginic acid, guar gum, a carboxylmethylcellulose, a hydroxymethylcellulose, or salts thereof, or combinations thereof.

8. The method of polishing according to claim 1, wherein the content of said water-soluble organic polymer(s) is 0.01% by weight to 3% by weight based on the total amount of the composition.

9. The method of polishing according to claim 1, wherein the content of said water-soluble organic polymer(s) is 0.05% by weight to 1.5% by weight based on the total amount of the composition.

10. The method of polishing according to claim 1, wherein said metal oxide particle comprises ceria having an average particle diameter, wherein the average particle diameter of said ceria is 0.03 µm to 0.5 µm, and the solid content of said metal oxide particles in the slurry composition is 0.1% by weight to 20% by weight based on the total amount of the composition.

11. The method of polishing according to claim 1, wherein said metal oxide particle comprises silica having an average particle diameter, wherein the average particle diameter of said silica is 0.03 µm to 0.5 µm, and the solid content of said metal oxide particles in the slurry composition is 0.1% by weight to 20% by weight based on the total amount of the composition.

12. The method of polishing according to claim 1, wherein said metal oxide particle comprises alumina having an average particle diameter, wherein the average particle diameter of said alumina is 0.03 µm to 0.5 µm, and the solid content of said metal oxide particles in the slurry composition is 0.1% by weight to 20% by weight based on the total amount of the composition.

13. The method of polishing a semiconductor substrate of claim 1, wherein the relative movement rate between the polishing pad and the substrate is within 30% of the relative movement rate that provides the maximum substrate removal rate at said polishing pressure.

14. The method of polishing a semiconductor substrate of claim 1, wherein the relative movement rate between the polishing pad and the substrate is within 15% of the relative movement rate that provides the maximum substrate removal rate at said polishing pressure.

15. The method of polishing a semiconductor substrate of claim 1, wherein the relative movement rate between the polishing pad and the substrate is the relative movement rate that provides the maximum substrate removal rate at said polishing pressure.

16. The method of polishing a semiconductor substrate of claim 1, wherein the relative movement rate between the polishing pad and the substrate varies, and wherein an average relative movement rate between the polishing pad and the substrate is within 30% of the relative movement rate that provides the peak maximum substrate removal rate at said polishing pressure.

17. The method of polishing a semiconductor substrate of claim 1, wherein the relative movement rate between the polishing pad and the substrate varies, and wherein an average relative movement rate between the polishing pad and the substrate is within 15% of the relative movement rate that provides the maximum substrate removal rate at said polishing pressure.

18. The method of polishing a semiconductor substrate of claim 1, wherein the polishing step comprises a first planarization step and a final polishing step, wherein different polishing slurry compositions are used in the first planarization step and the final polishing step.

19. The method according to claim 1, wherein the polishing step comprises a first planarization step and a final polishing step, and wherein the same polishing slurry composition is used in both the planarization step and the final polishing step.

20. The method according to claim 19, wherein the relative movement rate between the polishing pad and the substrate in the planarization step is higher than the relative movement rate between the polishing pad and the substrate in the final polishing step.

21. The method according to claim 19, wherein the polishing pressure in said planarization step is lower than the polishing pressure in said final polishing step, and wherein in both the planarization step and the final polishing step the relative movement rate between the polishing pad and the substrate is within 30% of the relative movement rate that provides the maximum substrate removal rate at the polishing pressure.

22. The method according to claim 19, wherein the polishing pressure in said planarization step is lower than the polishing pressure in said final polishing step, and wherein in both the planarization step and the final polishing step the relative movement rate between the polishing pad and the substrate is within 15% of the relative movement rate that provides the maximum substrate removal rate at the polishing pressure.

23. The method according to claim 18, wherein the polishing pressure in said planarization step is lower than the polishing pressure in said final polishing step and wherein the relative movement rate between the polishing pad and the substrate in the planarization step is higher than the relative movement rate between the polishing pad and the substrate in the final polishing step.

24. The method of claim 1 wherein the second average molecular weight of the second water-soluble organic polymer is between 30% to 60% of the first molecular weight.

25. A method of polishing a semiconductor substrate, which comprises:
   a) providing a semiconductor substrate having a dielectric film;
   b) providing a slurry composition comprising: abrasive ceria particles, a first water-soluble organic polymer having a first average molecular weight between 26,000 and 50,000, a second water-soluble organic polymer having a second average molecular weight that is between 25% to 75% of the first molecular weight, and water, wherein said polishing slurry composition is disposed between the substrate and a polishing pad; and
   c) holding a portion of the pad and the substrate in a position to create a polishing pressure and moving at least one of the polishing pad or substrate to obtain a relative movement rate between the polishing pad and the substrate, thereby polishing a semiconductor substrate to effect a substrate removal rate; wherein when the substrate is polished by contacting the substrate with the slurry composition disposed between the substrate and a polishing pad moving relative to the substrate, the relationship between the substrate removal rate compared with the movement of the pad relative to the substrate while maintaining a constant polishing pressure between the polishing pad and the substrate exhibits a maximum in the substrate removal rate.

26. The method of claim 25, wherein at least one of the first and second water soluble organic polymers is an ammonium polyacrylate, wherein the first average molecular weight is between 27,000 and 40,000, and the second average molecular weight is between 10,000 and 20,000.

27. The method according to claim 25, wherein the relative movement rate between the polishing pad and the substrate is within 15% of the relative movement rate that provides the maximum substrate removal rate at said polishing pressure.

28. The method according to claim 25, wherein the dielectric film comprises TEOS material.

29. The method according to claim 25, wherein the polishing step comprises a first planarization step and a final polishing step, and wherein the relative movement rate between the polishing pad and the substrate in the planarization step is higher than the relative movement rate between the polishing pad and the substrate in the final polishing step, the polishing pressure in said planarization step is lower than the polishing pressure in said final polishing step, and in both the planarization step and the final polishing step the relative movement rate between the polishing pad and the substrate is within 30% of the relative movement rate that provides the maximum substrate removal rate at the polishing pressure.

* * * * *